United States Patent [19]

Roggwiller et al.

[11] 4,386,283

[45] May 31, 1983

[54] PROCESS FOR THE CUTTING-OFF OF A THYRISTOR

[75] Inventors: Peter Roggwiller, Neerach-Riedt; Roland Sittig, Umiken, both of Switzerland

[73] Assignee: BBC, Brown, Boveri & Company, Limited, Baden, Switzerland

[21] Appl. No.: 182,047

[22] Filed: Aug. 28, 1980

[30] Foreign Application Priority Data

Aug. 31, 1979 [CH] Switzerland .................. 7894/79

[51] Int. Cl.³ ............................................. H03K 17/72
[52] U.S. Cl. .......................... 307/252 R; 307/252 A; 307/252 J; 307/305; 307/311; 357/30; 357/38
[58] Field of Search ........... 307/252 A, 252 R, 252 J, 307/252 M, 311, 305; 357/30, 38

[56] References Cited

U.S. PATENT DOCUMENTS

| | | | |
|---|---|---|---|
| 3,096,442 | 7/1963 | Stewart | 307/252 A |
| 3,476,941 | 11/1969 | Bonin | 307/311 |
| 3,535,532 | 10/1970 | Merryman | 307/311 |
| 3,694,670 | 9/1972 | Marzolf | 307/252 M |

Primary Examiner—John Zazworsky
Attorney, Agent, or Firm—Oblon, Fisher, Spivak, McClelland & Maier

[57] ABSTRACT

A process for interrupting load current in a thyristor to switch-off current conduction through the thyristor, as well as a semiconductor module for implementation of the process. In the process, a semiconductor diode is connected in parallel to the thyristor and a photocurrent is produced in the diode to switch-off current conduction in the thyristor, the diode then taking over the load current of the thyristor. The photocurrent can be optionally produced by means of an electro-magnetic radiation (light) or by means of a bombardment with electrons. The process permits considerable reduction in the complexity of the cut-off circuit and separation of this circuit in a galvanic fashion from the load circuit. The semiconductor module provided for implementing the process includes a thyristor and a radiation sensitive diode disposed in parallel with the thyristor and commonly integrated into the thyristor semiconductor structure.

9 Claims, 5 Drawing Figures

PROCESS FOR THE CUTTING-OFF OF A THYRISTOR

BACKGROUND OF THE INVENTION

1. Field of the Invention

This invention relates to a process for the switching-off of current conduction in a thyristor with the help of at least one additional semiconductor component connected in parallel to the thyristor wherein this additional component takes over the load current of the thyristor for a period of time which corresponds at least to the turn-off time of the thyristor, which in turn is related to the properties and the operational mode of the thyristor. This invention further relates to a semiconductor module for performing this process.

2. Description of the Prior Art

Thyristors are silicon semiconductor rectifier diodes which are used in many ways in signaling electronics as well as in high-performance electronics, for example, in control circuits, adjustable drives, inverted converters, rectifiers with controllable or adjustable output voltage, etc., owing to their long life, freedom from maintenance and insensitiveness to vibrations. The thyristor can be switched into a current-conductive state by means of a control impulse led to the gate. On the other hand, it is not possible to interrupt the local current flowing between the thyristor anode and cathode simply by means of a control signal applied to the gate. For this purpose, the load current must drop below the holding current which necessarily occurs at the end of each positive half wave in the case of an operation with alternating current and, for which purpose, additional quenching circuits are necessary for a controlled current interruption. Different designs of quenching or commutating circuits are known to the expert which are often more complex than the load circuit of the thyristor.

Therefore, a process has already been proposed for the switching-off of thyristors which can be carried out with considerably less circuit complexity. In this process, the load current of the thyristor is commuted to a component connected in parallel during the necessary release period. The component is preferably a semiconductor diode whose cathode is directly connected with the anode and whose anode is connected with the cathode of the thyristor over the secondary winding of a transmitter. In order to cut off the thyristor, a current impulse is produced in this secondary winding which flows through the diode and heterodynes the load current in the thyristor. This current impulse acts as charging current which floods the diode with charge carriers so that the diode takes over the pertinent backward current and the load current of the thyristor with the reversion of the current impulse effected by the circuit inductivity.

At least two conditions must be met to carry out this process. Firstly, the inductivity of the diode-thyristor circuit must be very small so that the backward current sets in through the diode before the blocking delay charge is recombined. Secondly, this charging current impulse must be considerably larger than the instantaneous value of the load current to be cut out so that the backward current can commutate this load current to the diode. These conditions and the circumstance that the charging current heterodynes the load current in the thyristor in the forward direction have limited the application of this process, so far, only to some special circuits.

SUMMARY OF THE INVENTION

It is, therefore, one objection of this invention to provide a process for the switching-off of a thyristor in which the diode-thyristor circuit has no transmitter inductivity delaying the clearance time.

Another object is to provide a novel process of the above noted type in which the thyristor is not subjected to an additional charging current and which can be carried out with a comparatively moderate circuit complexity.

These and other objects are achieved according to the process of the invention by producing a photocurrent in the semiconductor component whose current intensity is at least equal to the magnitude of the instantaneous value of the load current and which produces a voltage different on the outside connections of the component which is lower than the voltage drop of the current-conducting thyristor.

According to the process of this invention, the photocurrent to be produced flows in the same direction as does the load current in the thyristor. Therefore, no oscillation of the charge current is necessary for the reversal of direction. Advantageously, the thyristor therefore is not additionally subjected to the charging current, it is not necessary that the photocurrent must be considerably larger than the load current to be commutated, the commutation is not delayed by the oscillation time of the charging current and the thyristor-semiconductor component circuit need not have inductivity. Furthermore, the new process can be carried out as potential-free process when the system to release the photocurrent is electrically separated from the load circuit.

Preferably, the photocurrent in the semiconductor component is produced by means of an electro-magnetic or a particle radiation.

A semiconductor module suitable to carry out the process of the invention contains the thyristor and at least a component connected in parallel in an integrated arrangement. Preferably, this component is designed as a photodiode with a p-n-structure whose blocking voltage is at least of the same magnitude as that of the thyristor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
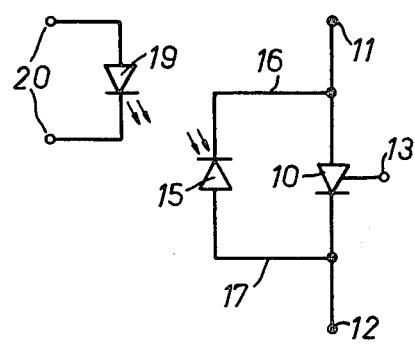
FIG. 1 is a circuit diagram of a circuit including a thyristor and a semiconductor diode for implementing the process according to the invention.

Referring now to the drawings, wherein like reference numerals designate identical or corresponding parts throughout the several views, and more particularly to FIG. 1 thereof, there is shown a principal circuit for implementing the process according to the invention. The circuit contains a thyristor 10 whose anode and cathode are connected with the terminals 11 or 12, respectively, of a load current line and whose gate is connected with the terminal 13 of an ignition or control circuit. The circuit contains additionally a semiconductor diode 15 whose anode is connected with the cathode of the thyristor through line 17. Furthermore, a light source 19 is provided to which is applied an exciting circuit 20, the details of which are not shown. The light source and the semiconductor diode are aligned with each other so that the light produced by the light source strikes the light-sensitive surface of the diode.

For the description of the operating mode of this circuit, it is assumed that the thyristor was placed into the conductive state by means of a suitable ignition impulse at the terminal 13 and a load current flows from the terminal 11 through the thyristor to the terminal 12. The forward voltage of the thyristor, i.e. the voltage drop between the anode and the cathode, amounts then to about 1 to 2 volts. The same voltage is then at the semiconductor diode which is connected in antiparallel relation. The light source is energized to switch-off the thyristor when the light striking the semiconductor diode produces a photocurrent in the diode which floods the blocking layer in the diode so that the blocking voltage is reduced to only about 0.5 volts. As soon as the blocking voltage in the parallel branch is lower than the forward voltage of the thyristor, the load current commutates in the parallel branch and the thyristor blocks as soon as the current in the thyristor branch has dropped below the holding current.

It is necessary for the described operating mode that the blocking voltage of the diode exposed to the light is lower than the forward voltage of the thyristor, that the photocurrent is at least of the same magnitude as the load current at the point in time of the commutating and that sufficient charge carriers are released in the diode so that the load current can flow through the diode during the entire turn-off time of the thyristor. The latter condition can be met in two ways: producing a photocurrent during the entire turn-off time or by producing a charge carrier reservoir for a short period of time whose life is at least equal to the turn-off time of the thyristor. However, the latter operating mode assumes that the delay of the commutating caused by the inductivity of the thyristor-diode circuit is short in comparison with the life of the charge carrier reservoir.

Figure 2:
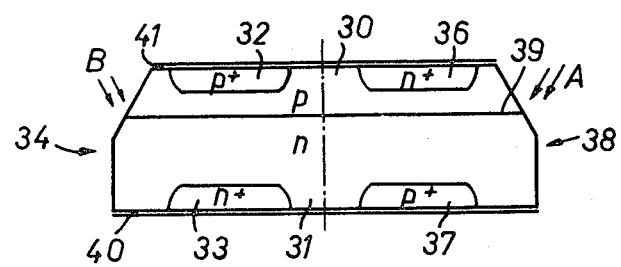
FIG. 2 is a schematic cross-sectional view of a semiconductor module provided with the integrated arrangement of a thyristor and a semiconductor diode.

FIG. 2 shows in schematic form, a semiconductor module provided for implementing the process according to the invention. The module contains a base with a p- and an n-conductive layer 30, 31. On one side (in the Figure on the left side), a $p^+$-anode zone 32 is installed in the p-layer 30 of the base and, in the opposite area of the n-layer, an $n^+$-cathode zone 33. This sequence of layers forms a diode 34. On the other side (in the Figure on the right side) of the module, an $n^+$-cathode zone 36 is installed in the p-layer 30 and, in the opposite area of the n-layer 31, a $p^+$-anode zone 37, which sequence of layers forms a thyristor 38. The adjacent anode and cathode zones 37 or 33, respectively, as well as the adjacent cathode and anode zones 36 or 32, respectively, of the thyristor and of the diode, respectively, are connected with each other by means of metallically conductive contact layers 40 or 41, respectively. The described module has the advantage that the thyristor 38 is ignited by means of radiation into the area A, i.e. potential-free, and is switched-off by means of also potential-free energy radiation into the area B of the blocking layer of the diode 34. Another advantage is the negligibly low inductivity of the connecting lines formed by the contact layers 40 or 41, respectively, which permits practically undelayed commutating of the load current from the thyristor to the diode. The potential-free igniting and switching-off of the thyristor and the practically delay-free commutating of the load current permit the use of this module particularly in signaling electronics where relatively low load currents are used by very fast switching times are required.

Figure 3:
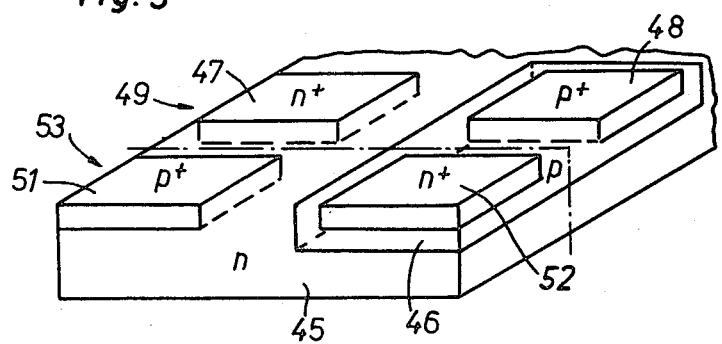
FIG. 3 is a schematic perspective view of a semiconductor module provided with an integrated planar arrangement of a thyristor and a semiconductor diode.

FIG. 3 shows also in schematic form a semiconductor module provided for the execution of the process of the invention, which is designed in planar form in contrast to the module in accordance with FIG. 2. This module contains a disk 45 of an n-conductive material into which a first p-conductive layer 46 is diffused and forms the base with this layer. Additionally, an $n^+$-zone 47 is diffused (in the rear portion of the module in the Figure) into the n-conductive disk and a $p^+$-zone 48 into the p-conductive layer which form the cathode and anode zones, respectively, of a diode 49. In the front portion of the module in the Figure, a $p^+$-zone 51 is diffused into the n-conductive disk and an $n^+$-zone 52 into the p-conductive layer 46 which form the anode and cathode zones, respectively, of a thyristor 53. In order to present a simplified representation, the contact layers are not shown for this module. Needless to say, in the case of this module, the individual zones can be arranged in optionally different configurations than the ones which are schematically represented in cubic form. This module has similar properties and advantages as the module according to FIG. 2.

Figure 4:
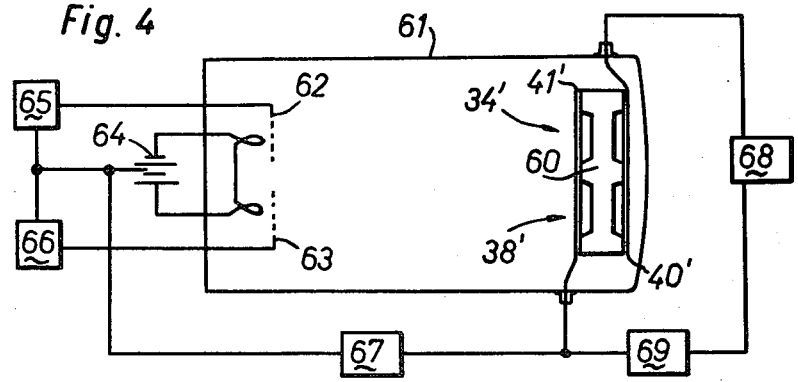
FIG. 4 is a schematic circuit diagram of a semiconductor module according to FIG. 2 which is arranged in an electron tube.

FIG. 4 shows the use of a module in accordance with FIG. 2 whereby a control through radiation with electrons is provided instead of the control through light. For this purpose, the module 60 is placed into an electron tube 61 an an anode. The shown tube has two independent control grids 62, 63 which are connected with the control circuits 65 or 66, respectively. The semiconductor module is arranged in such a way that the electronic current controlled by grid 62 gets to the diode portion 34' and the electronic current controlled by grid 63 gets to the thyristor portion 38'. The contact layer 41' towards the control grids is connected with a high voltage source 67 over a sealing whose other outlet is led to the center pickup of a current source 64 for the cathode. The contact layer 40' away from the control grids is connected with a load circuit 68 over another sealing which, in turn, is connected with the sealing for the contact layer 41' towards the control grids over a current source 69.

During the operation of the circuit, the thyristor 38' is ignited through a short gating of the control grid 63 and current flows from the current source 69 through the thyristor and the load circuit 68. Charge carriers are produced in the diode 34' through the gating of the control grid 62 which flood the blocking layer of the diode and form a blocking delay charge due to which the blocking voltage of the diode drops to a value which is lower than the forward voltage of the thyristor so that the load current commutates from the thyristor to the diode. Also, with this circuit it is possible to radiate the diode optionally with electrons during the entire release period of the thyristor which then produces a photocurrent suitable to take over the load current or to radiate the diode with sufficient electrons only during a short period of time so that a charge carrier reservoir is produced in the blocking layer whose life corresponds approximately to the turn-off time of the thyristor.

In order to verify the new process, a circuit was constructed which permits measuring the course in time of current and voltage through and at the thyristor, respectively, during the period of thyristor cutting-off. The circuit contained a 16 μF capacitor which was connected with a 50 volt direct current source over a 50Ω charging resistance. The discharge circuit of the capacitor consisted of a 10Ω ballast resistor and a thyristor connected in series. A diode provided for the switching-off of the thyristor was connected in antiparallel to the thyristor. An Nd:YAG laser was used as the radiation source for the ignition of the diode.

Figure 5:
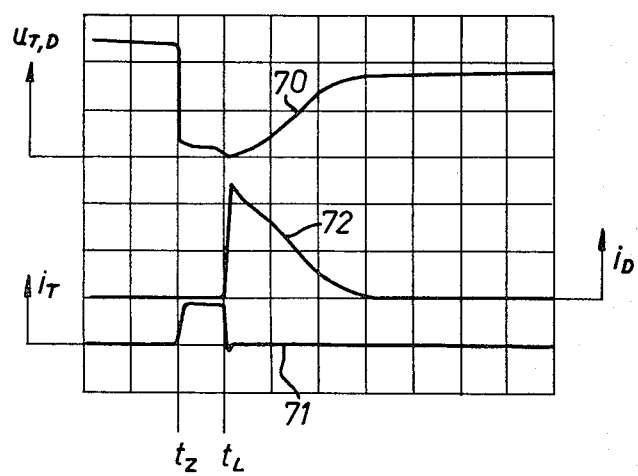
FIG. 5 is an oscillogram illustrating the voltage and current waveforms generated in the switching-off of a thyristor according to the process of the invention.

FIG. 5 shows the image of an oscillogram with the curve 70 corresponding to the voltage course across the thyristor and the diode, the curve 71 corresponding to the current course through the thyristor and the curve 72 corresponding to the current course through the diode. The vertical deflection for curves 70 and 71 amounted to 20 V/graduation or 5 A/graduation, respectively, and the vertical deflection for curve 72 amounted to 2 A/graduation. The horizontal deflection for all three curves amounted to 20 μs/graduation. It can be recognized from the oscillogram that the voltage at the thyristor and at the diode amounted to practically 50 volts up to the point in time $t_z$ and no current flowed through the thyristor or through the diode. At the point in time $t_z$, the thyristor was ignited in a conventional manner. Then the current started flowing suddenly which was limited to about 5 A by the ballast resistor and the voltage across the thyristor dropped to about 1.3 volts. After 20 μs, the diode was radiated by the laser for about 0.2 μs and so much charge carrier was produced that the voltage across the diode and the thyristor dropped to about 0.6 volt and, consequently, the diode took over the discharge current of about 5 A. The current through the diode continuously decreased because of the increasing reduction of charge carriers and the voltage across the diode and the thyristor rose again to the former value of about 1.3 volts within 8 μs without the thyristor taking over again in conducting of the current. The reduction of the charge carrier reservoir in the diode and, consequently, also the current flow through the diode lasted, in all, about 60 μs during which time the voltage at the thyristor and at the diode increased to the voltage remaining after the discharge in the capacitor amounting to about 35 volts.

Needless to say, the design can be adapted to special operational conditions. For example, instead of the directly heated cathode shown, also indirectly heated cathodes can be used. It is also possible to use instead of the two shown electron radiation systems only one such system and to focus the electron beam electrostatically or magnetically and to direct it on the thyristor or the diode.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for switching-off of a thyristor by means of at least one semiconductor diode connected in antiparallel to the thyristor, said thyristor exhibiting a predetermined turn-off time and adapted to conduct a load current resulting in a voltage drop across said thyristor, wherein said diode takes over conduction of the load current of the thyristor for a period of time which corresponds at least to the turn-off time of the thyristor, comprising:

producing a photocurrent in the semiconductor diode with a current intensity at least as great as the magnitude of the instantaneous value of the thyristor load current;

whereby said photocurrent produces a voltage difference across said diode which is lower than the voltage drop across the current-conducting thyristor.

2. A process according to claim 1, further comprising:

producing the photocurrent by means of electromagnetic radiation.

3. A process according to claim 1, further comprising:

using a light-ignitable thyristor and a photodiode as said thyristor and said diode, respectively, applying a first light impulse to said light-ignitable thyristor to produce ignition of said light-ignitable thyristor; and applying a second light impulse to said photodiode to produce said photocurrent in said component.

4. A process according to claim 1, further comprising:

producing said photocurrent by means of particle radiation.

5. A process according to claim 4, further comprising:

radiating said semiconductor diode with electrons to produce said photocurrent.

6. A process according to claim 5, further comprising:

using a thyristor which can be ignited by radiation with electrons as said thyristor;

radiating said thyristor with an electronic current impulse to produce ignition thereof; and radiating said diode with an electronic current impulse to effect switching-off of said thyristor by the production of the photocurrent in the semiconductor diode.

7. A semiconductor module adaptable for use in circuit with a load and a source of load current to be applied to said load, comprising:

at least one thyristor exhibiting a predetermined turn-off time and adapted to conduct the load current which produces a voltage drop across the thyristor;

at least one semiconductor diode integrally fabricated with said thyristor in antiparallel therewith, said diode being radiation sensitive and upon impingement of radiation, capable of producing a photocurrent at least as great as the magnitude of the instantaneous value of said load current to produce a voltage difference across said diode which is lower than the voltage drop across said thyristor, said diode capable of taking over conduction of said load current of said at least one thyristor for a period of time corresponding at least to the turn-off time of said thyristor to switch-off current conduction through said thyristor.

8. A new use for a module according to claim 7, comprising:
using the module as an anode in an electronic valve, said valve comprising two independently controllable grids.

9. A semiconductor module according to claim 7, further comprising:
said semiconductor diode exhibiting a blocking voltage at least as high as the blocking voltage of said at least one thyristor.

* * * * *